(12) United States Patent
Chen et al.

(10) Patent No.: US 7,268,624 B2
(45) Date of Patent: Sep. 11, 2007

(54) DIFFERENTIAL AMPLIFIER OFFSET VOLTAGE MINIMIZATION INDEPENDENTLY FROM COMMON MODE VOLTAGE ADJUSTMENT

(75) Inventors: Minhan Chen, Cary, NC (US); Westerfield John Ficken, Cary, NC (US); Louis Lu-Chen Hsu, Fishkill, NY (US); Steven J. Zier, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 11/203,860

(22) Filed: Aug. 15, 2005

(65) Prior Publication Data

US 2007/0035342 A1    Feb. 15, 2007

(51) Int. Cl.
*H03F 3/45* (2006.01)
(52) U.S. Cl. ............................ 330/258; 330/2; 330/253
(58) Field of Classification Search ...................... None
See application file for complete search history.

(56) References Cited

U.S. PATENT DOCUMENTS

| 6,459,335 | B1 | 10/2002 | Darmaswaskita et al. ...... 330/9 |
| 6,515,464 | B1 | 2/2003 | Darmaswaskita et al. ........................ 324/76.11 |
| 6,714,886 | B2 | 3/2004 | Sung et al. .................. 702/107 |
| 6,737,913 | B2 * | 5/2004 | Goldenberg .................... 330/2 |
| 6,831,521 | B1 | 12/2004 | Abidin et al. ............... 330/308 |
| 7,095,281 | B2 * | 8/2006 | Zipper et al. ............... 330/258 |
| 2004/0227567 | A1 | 11/2004 | Llewellyn ...................... 330/9 |

FOREIGN PATENT DOCUMENTS

JP    56023049 A    3/1981

* cited by examiner

*Primary Examiner*—Khanh Van Nguyen
(74) *Attorney, Agent, or Firm*—Joscelyn G. Cockburn

(57) ABSTRACT

Offset voltages in differential amplifiers are minimized by controlling compensation currents through the load impedances of the amplifiers. The currents are varied while sensing the polarity of the offset voltage. When the polarity changes, the current values are latched to keep the offset voltage at a minimum.

13 Claims, 4 Drawing Sheets

| STATE | 102A | 102B | IA | IB |
|-------|------|------|-----|-----|
| 1 | 0000 | 1100 | 0 | 12i |
| 2 | 0001 | 1011 | i | 11i |
| 3 | 0010 | 1010 | 2i | 10i |
| 4 | 0011 | 1001 | 3i | 9i |
| 5 | 0100 | 1000 | 4i | 8i |
| 6 | 0101 | 0111 | 5i | 7i |
| 7 | 0110 | 0110 | 6i | 6i |
| 8 | 0111 | 0101 | 7i | 5i |
| 9 | 1000 | 0100 | 8i | 4i |
| 10 | 1001 | 0011 | 9i | 3i |
| 11 | 1010 | 0010 | 10i | 2i |
| 12 | 1011 | 0001 | 11i | i |
| 13 | 1100 | 0000 | 12i | 0 |

DIFFERENTIAL AMPLIFIER OFFSET VOLTAGE MINIMIZATION INDEPENDENTLY FROM COMMON MODE VOLTAGE ADJUSTMENT

BACKGROUND OF THE INVENTION

1. Field of the Invention

This invention relates to differential amplifier compensation. Particularly, it relates to increasing the common mode rejection ratio of differential amplifiers. More particularly, it relates to the compensation of differential amplifiers to correct for offset voltages due to unbalance in amplifier component parameters.

2. Description of the Related Art

In the prior art, input offset voltages of differential amplifiers used as signal level detectors are reduced by increasing the size of input devices which in effect reduces their bandwidth because of the parasitic capacitance of the larger devices.

Another prior art approach to reducing offset voltages is to adjust the common mode voltage of the differential amplifier. This reduces the sensitivity for the amplifiers' use as signal level detectors and complicates the amplifier design by having to implement additional circuitry for common mode compensation.

A further prior art approach is to compensate the offset voltage by the addition of an offset voltage at the single-ended input of the differential amplifier. While compensating for the offset voltage, however, the common mode voltage of the differential amplifier will vary. This reduces the sensitivity for the differential amplifiers' use as signal level detectors and complicates the amplifier design by the necessity to implement provisions of additional circuitry for common mode signal regulation.

BRIEF SUMMARY OF THE INVENTION

Compensation for offset voltages in differential amplifiers is provided by a pair of adjustable current sources for supplying current through the differential amplifier' load impedances. The polarity of the amplifier' output voltage is sensed and the currents through the load impedances are varied until the polarity of the amplifier' output signal changes. The control signals to the adjustable current sources are latched to maintain the current constant. In an embodiment of the invention, the currents are varied stepwise.

The invention is useful with differential amplifiers in general because the invention can be used with extant differential amplifiers.

BRIEF DESCRIPTION OF THE DRAWING

The invention is described in detail by referring to the various figures which illustrate specific embodiments of the invention, and wherein like numerals refer to like elements.

DETAILED DESCRIPTION OF THE INVENTION

When input signals to a differential amplifier are zeroed, the output signals are not necessarily zero due to several sources of unbalance such as asymmetry of the parameters of the differential amplifier' devices. The output voltage from an amplifier due to such asymmetries is referred to herein as the offset voltage.

Figure 1:
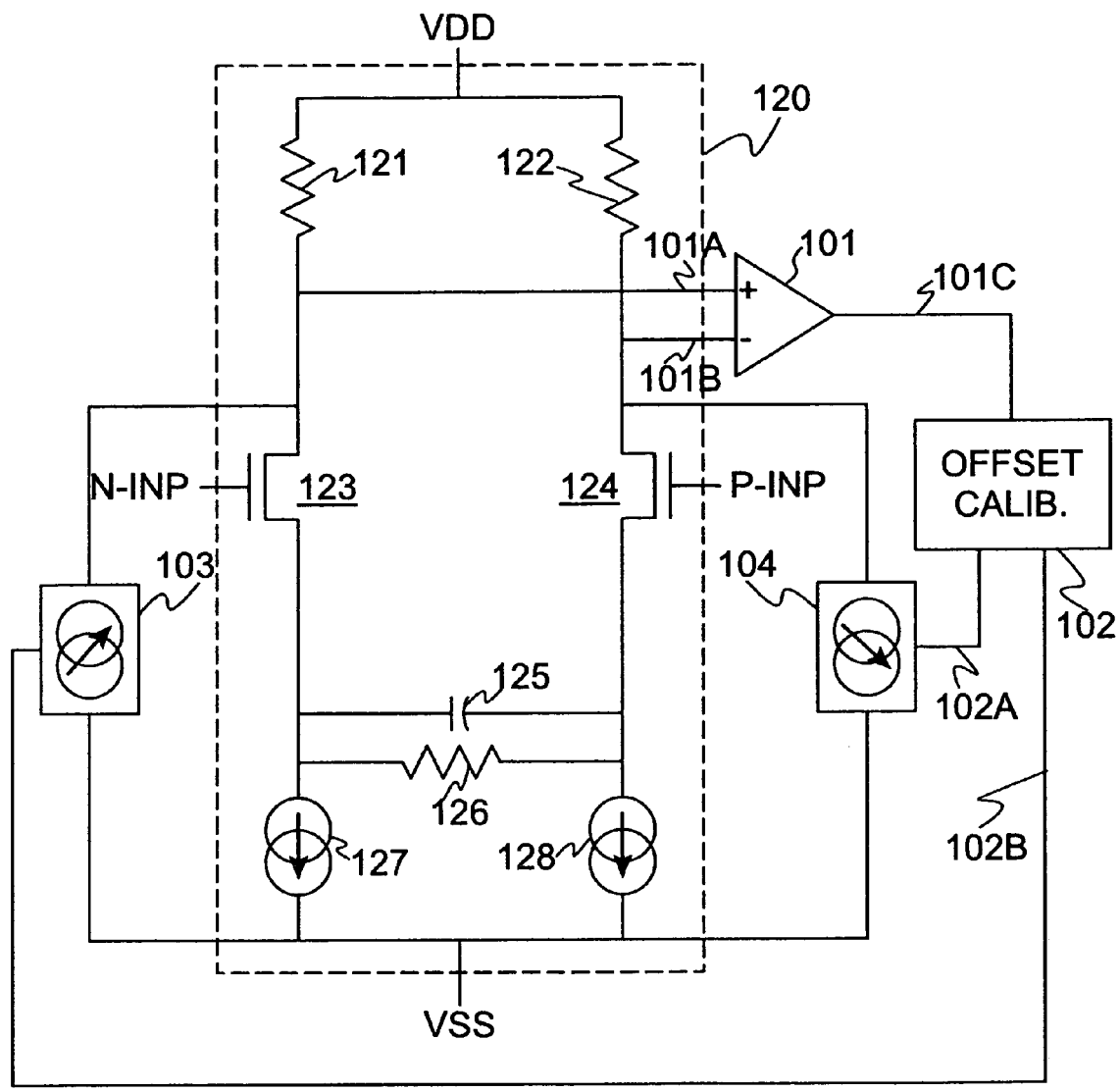
FIG. 1 is an illustration of a preferred embodiment of the invention.

In the embodiment of the invention illustrated in FIG. 1, a differential amplifier 120 comprises load impedances 121 and 122, associated transistors 123 and 124, common mode rejection devices such as capacitor 125 and impedance 126, and serial current sources 127 and 128. Negative and positive input signals (N-INP and P-INP) are applied to the input terminals of the transistors 123 and 124, respectively.

The current digital-to-analog converters (IDACs) 103 and 104 are coupled across the transistors 123 and 124 and their associated serial components such as fixed current sources 127 and 128, so as to supply current through the load impedances 121 and 122 independently from the operation of the differential amplifier 120. The differential output signals on lines 101A and 101B are coupled to an operational amplifier 101 which acts as a polarity sensor. The output signal from the amplifier 101 is high if the voltage difference between its input lines 101A and 102B is positive and low if negative, or vice versa. The purpose of the amplifier 101 is to detect changes in polarity The output signal from the amplifier 101 on line 101 C is coupled to an offset calibration circuit 102. The output signals from the offset calibration circuit 102 on lines 102A and 102B comprise multi-bit digital signals which are coupled to the control input terminals of the IDACs 104 and 103, respectively.

It can be seen that since a circuit according to the invention requires access only to the output terminals and common voltage returns of differential amplifiers, it is generally useful with all differential amplifiers.

With zero input signals N-INP and P-INP, the voltage across the output terminals of the differential amplifier 120 output terminals, and thus across the input terminals of the amplifier 101, is not necessarily zero due to asymmetry of the load impedances 121 and 122, the characteristics of the transistors 123 and 124, the current sources 127 and 128, and other amplifier parameters. A signal representative of the polarity of any unbalance in the input signals to the amplifier 101 is applied to an offset calibration circuit 102 from its output terminal via line 101C.

The digital output signals from the offset calibration circuit 102 control the offset currents through the load impedances 121 and 122 which alters the offset voltage at the input to the amplifier 101. The current introduced into the circuit by the IDAC 104 is controlled by the digital signal on the multi-line 102A and the current introduced by the IDAC 103 is controlled by the digital signal on multi-line 102B from the offset calibration circuit 102. The directions of currents in the IDACs 103 and 104 are in opposing directions.

The currents from the IDACs 104 and 103 create a voltage across the load impedances 121 and 122. These voltages can be varied to cause a reduction in the offset voltage of the system.

The control signals from the offset calibration circuit 102 are sequentially stepped during a calibration phase until the polarity of the output signals from the amplifier 120, and consequently the input signals 101A and 101B to the amplifier 101, is reversed. The control signals on the lines 102A and 102B are then kept constant to maintain the offset voltage signal in the differential amplifier 120 at a minimum.

Figures 2, 3:
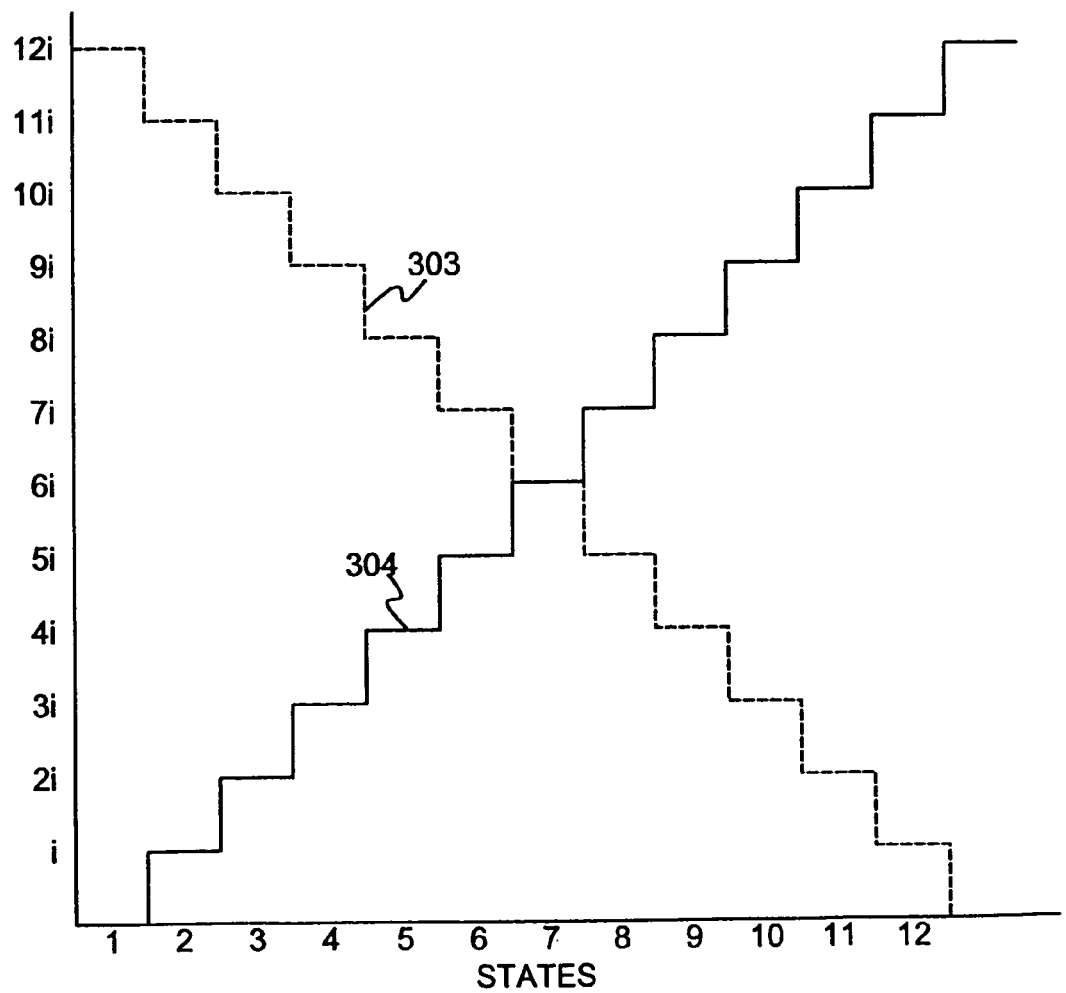
FIG. 2 is a table showing exemplary signals for explanation purposes.
FIG. 3 is a graphical representation of illustrative currents in the IDACs.

FIG. 2 is a table showing an example of output signals from the offset calibrator 102 and the corresponding currents in the IDACs 104 and 103. The first column is a state identification number which is useful if the offset calibration circuit 102 is implemented in software. The second and third columns are digital four-bit output signals on lines 102A and 102B. The fourth and fifth columns are the current values in the IDACs 104 and 103, respectively, in response to the control signals. The latter are denoted in terms of multiples of an incremental current, i, which is selected depending on the IDAC. and the differential amplifier's characteristics.

Figure 4:
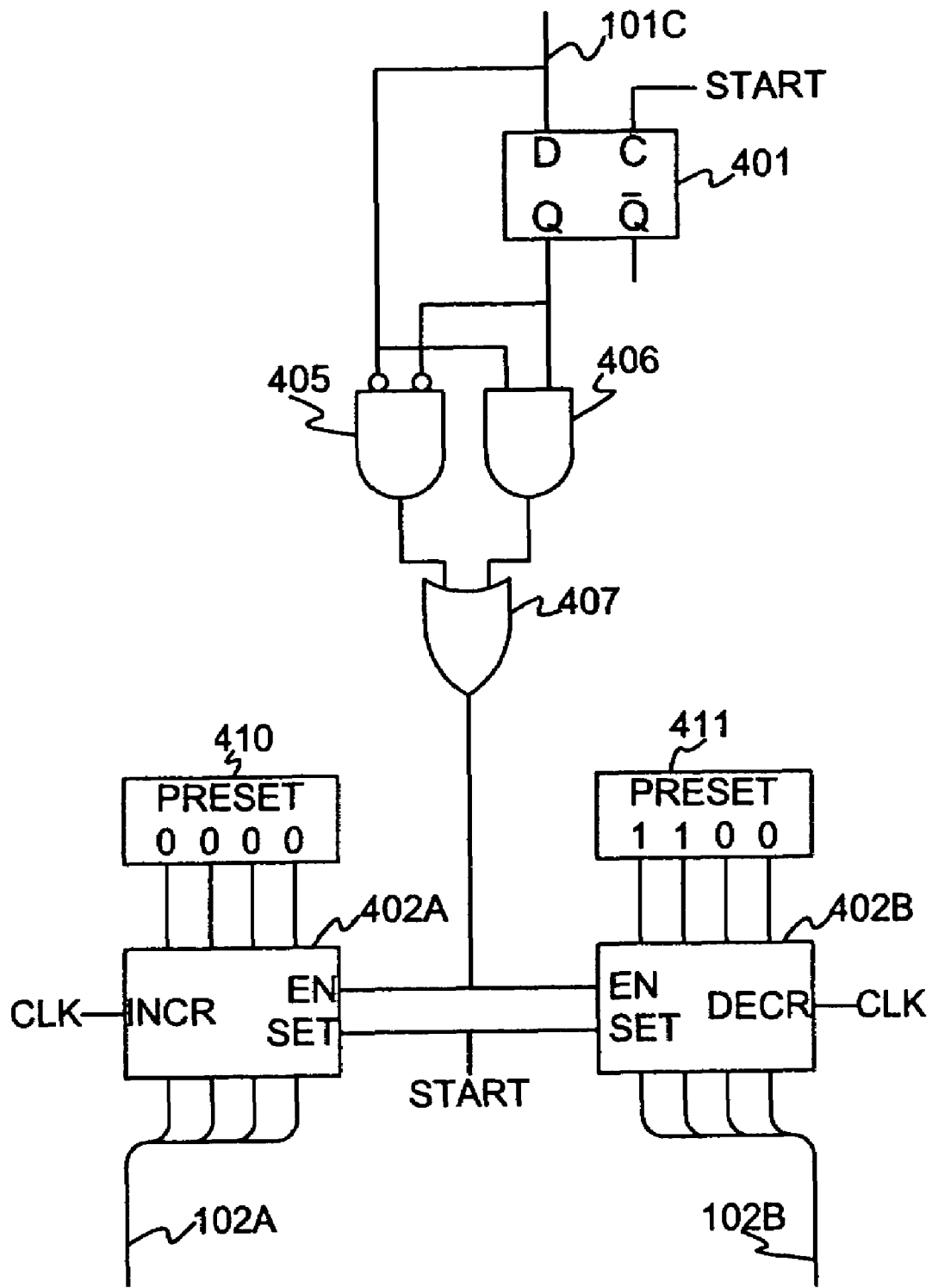
FIG. 4 is a logic diagram of a circuit useful for an offset calibration circuit useful in the invention.

FIG. 3 is a graph of the IDAC currents. The current in IDAC 104 is denoted by graph line 304 and that in IDAC 103 by the dotted graph line 303. The values depicted in FIGS. 2, 3, and 4 are only for illustrative purposes of explanation. In practice, determination of actual values would be well within the skill of the art given the teachings of the invention.

A circuit for the offset calibration device 102 is shown in FIG. 4. A D-type flip-flop 401 has its data input D coupled to the output signal line 101C from the amplifier 101 of FIG. 1. If it is high, a START signal, to begin calibration, will set the flip-flop 401. Otherwise, the flip-flop 401 will be reset. The output signals from the flip-flop 401 and from the amplifier 101 are compared by a comparator circuit comprised of a NOR gate 405, an AND gate 406, and an OR gate 407. The output signal from the OR gate 407 remains high so long as the output signals from the flip-flop 401 and the differential amplifier 101 remain the same.

The high output signal from the OR gate 407 enables a pair of digital counters 402A and 402B. The count in the digital counter 402A is preset to binary 0000 by the output signals from a preset register 410 by the START signal. The count in the digital counter 402B is preset to binary 1100 by the output signals from a preset register 411 by the START signal.

The digital counter 402A is incremented by a clock (CLK) signal while the digital counter 402B is decremented by the CLK signal. When the polarity of the output signal from the differential amplifier 101 changes, the output signal from the OR gate 407 goes low, removing the enable (EN) signal from the digital counters 402A and 402B. This in effect latches their output digital signals on lines 102A and 102B. This keeps the currents from the IDACs 104 and 103 in FIG. 1 at the values which make the offset voltage a minimum.

In summary, the control signals of the IDACs 104 and 103 are sequentially stepped up and down, respectively, producing a differential offset compensation voltage across the load impedances 121 and 122, respectively. The polarity of their difference is sensed by the amplifier 101. The differential offset compensation voltage is thereby stepped up from a negative polarity to a positive polarity sequentially.

The polarity of the signal from the differential amplifier 101 will reverse at the point in the process where the intrinsic offset caused by the system is compensated by the generated offset compensation voltages across the load impedances 121 and 122. When the polarity of the offset signal from the differential amplifier 120 changes, the control output signals from the offset calibration circuit 102 on lines 102A and 102B and thus the IDAC currents are latched at their values, keeping the offset voltage constant at a minimum.

Figure 5:
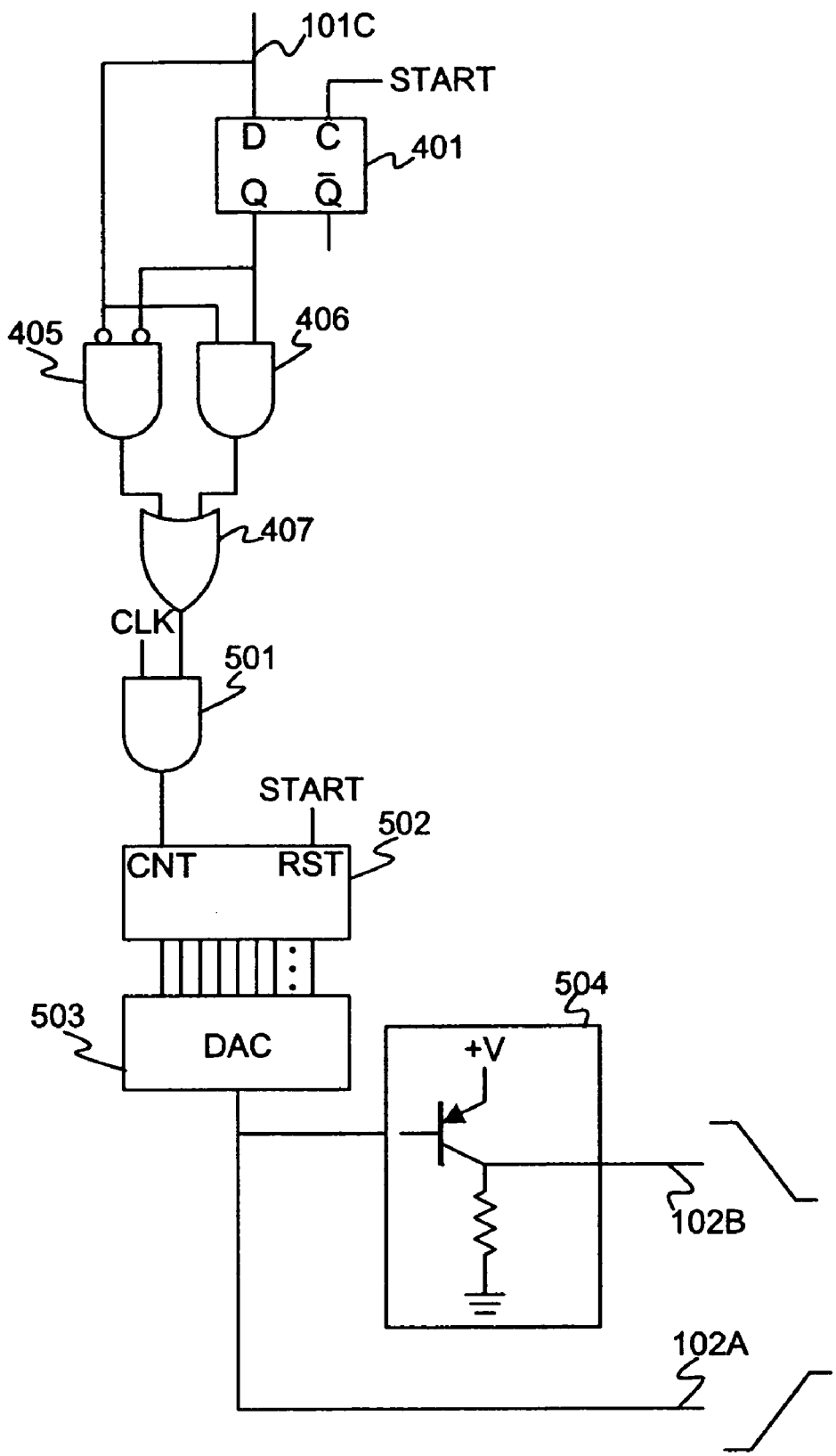
FIG. 5 is an illustration of an alternate circuit for an offset calibration circuit.

An alternate implementation of an offset calibration circuit is illustrated in FIG. 5 for an embodiment using voltage-to-current converters (VICs) in place of IDACs 104 and 103.

The circuit of FIG. 5 supplies a varying voltage to the control input terminals of the VICs. A polarity detector for providing an enabling signal is as described in connection with FIG. 4. A high output signal from the OR gate 407 is applied to an AND gate 501 to gate a clock signal to a counter 502. The output from the counter 502 is coupled to an analog-to-digital converter (DAC) 503. The analog voltage from the DAC 503 is supplied to the VIC 104 on line 102A. It is also applied to a voltage inverter 504 which has its output signal coupled to the VIC 103 via line 102B. This arrangement has the added advantage that it can supply varying currents that are relatively continuous by increasing the number of counter stages, allowing for more accurate minimization of the offset voltage. The degree of control can be improved by using counters and DACs with additional bit capabilities. It also reduces the complexity of the circuits by the use of VICs and only a single counter.

The implementation of an offset calibration circuit using software is within the skill of the art given the preceding description of a hardware implementation.

The circuits shown and described are suitable for implementation on integrated circuit chips along with the differential amplifier circuits.

While the invention has been particularly shown and described with reference to a preferred embodiment thereof, it will be understood by those skilled in the art that various changes and modifications in form and details may be made therein without departing from the spirit and scope of the invention as defined by the following claims.

What is claimed is:

1. A offset compensation circuit for differential amplifiers having first and second load impedances and first and second differential output signal terminal means and output terminal means comprising, in combination:

first and second adjustable current source means coupled to said differential amplifier means for supplying currents through said first and second load impedances, respectively, said first and second adjustable current source means including control input means for determining the amount of current to be supplied;

polarity determining means coupled to said first and second output terminal means for supplying an output signal indicative of polarity of an output signal across said differential output signal terminal means;

offset calibration means responsive to the output signal from said polarity determining means for supplying control signals to the control input means of said first and second adjustable current source means; and means in said offset calibration means for varying said control signals until said output signal from the polarity determining means indicates a change in polarity.

2. The offset compensation means as claimed in claim 1 wherein said offset calibration means includes means coupled to said polarity determining means for latching said control signals atthe value which caused a change in polarity.

3. The offset compensation means as claimed in claim 2 wherein the offset calibration means includes sensing means responsive to the output signal from said polarity determining means for supplying an enabling signal, said enabling signal dependent on changes of polarity across said differential output signal means.

4. The offset compensation means as claimed in claim 3 wherein said offset calibration means include:

first and second counter means responsive to the enabling signal from said sensing means for supplying said control signals to the control input means of said first and second adjustable current source means; and wherein said first and second adjustable current source means include digital-to-analog converter means.

5. The offset compensation means as claimed in claim 4 wherein said first and second counter means include:

preset means for initializing the count value in said first and second counter means in response to a signal indicative of starting a calibration phase; and means for incrementing and decrementing said first and second counter means, respectively.

6. The offset compensation means as claimed in claim 3 wherein said offset calibration means includes:

counter means responsive to the enabling signal from said sensing means;

means for incrementing said counter means; and converting means for converting the count value in said counter means to control signals from the offset calibration means.

7. The offset compensation means as claimed in claim 6 wherein said converting means includes:

digital-to-analog means for supplying voltage control signals to to the control input means of said first and second adjustable current source means; and wherein said first and second adjustable current source means are voltage-to-current conversion means.

8. The offset compensation means as claimed in claim 7 including voltage inverter means responsive to said digital-to-analog converter means.

9. The offset compensation means as claimed in claim 8 including:

means for coupling said digital-to-analog means to the control input means of said first adjustable current source means; and means for coupling said voltage inverter means to the control input means of said second adjustable current source means.

10. A method of minimizing offset voltage in a differential amplifier comprising the steps of:

supplying a pair of currents through load impedances of the differential amplifier;

controlling the pair of currents in opposing directions;

sensing the polarity of the differential amplifier's output signals during a calibration phase; and latching the pair of currents at a value where the polarity of the differential amplifiers output signals changes.

11. The method of minimizing offset voltage in a differential amplifier as claimed in claim 10 including an additional step of varying the current during the calibration phase.

12. The method of minimizing offset voltage in a differential amplifier as claimed in claim 11 including an additional step of making the current vary in a stepwise fashion.

13. A method of minimizing an offset current in differential amplifiers comprising the steps of:

providing a pair of controllable opposing direction currents, one in each branch of a differential amplifier;

varying the strengths of the pair of controllable opposing direction currents;

sensing the differential amplifier's output signals' polarity; and latching the pair of controllable opposing direction currents at a value where the polarity changes.

* * * * *